(12) United States Patent
Vandenbossche

(10) Patent No.: US 6,271,607 B1
(45) Date of Patent: Aug. 7, 2001

(54) SUB-ASSEMBLIES WITH ELECTRONIC COMPONENTS, FOR MOTOR VEHICLE ALTERNATORS

(75) Inventor: Mathieu Vandenbossche, Paris (FR)

(73) Assignee: Valeo Equipments Electriques Moteur, Creteil (FR)

( * ) Notice: Subject to any disclaimer, the term of this patent is extended or adjusted under 35 U.S.C. 154(b) by 0 days.

(21) Appl. No.: 09/338,825

(22) Filed: Jun. 23, 1999

(30) Foreign Application Priority Data

Jun. 26, 1998 (FR) .................................................. 98 08126

(51) Int. Cl.[7] ............................. H02K 11/00; H02M 1/00
(52) U.S. Cl. ........................ 310/68 D; 363/144; 363/145
(58) Field of Search ................... 310/68 D, 43, 310/45, 68 R; 363/144, 145, 146, 147

(56) References Cited

U.S. PATENT DOCUMENTS

| 3,895,247 | * | 7/1975 | Iwata et al. ...................... 310/68 D |
| 4,321,664 | * | 3/1982 | Matthai ............................... 363/141 |
| 4,992,688 |   | 2/1991 | Cap et al. ............................... 310/71 |
| 5,248,910 | * | 9/1993 | Yockey et al. ...................... 310/68 R |
| 5,386,343 |   | 1/1995 | Pao ...................................... 361/761 |
| 5,677,616 |   | 10/1997 | Ooiwa ................................. 322/17 |
| 5,747,875 |   | 5/1998 | Oshima ............................... 257/687 |
| 5,821,674 | * | 10/1998 | Weiner ............................. 310/68 D |
| 5,838,544 | * | 11/1998 | Wei .................................... 361/704 |

FOREIGN PATENT DOCUMENTS 0 258 691   8/1987   (EP) .

OTHER PUBLICATIONS

French Search Report dated Feb. 12, 1999.

* cited by examiner

*Primary Examiner*—Nestor Ramirez
*Assistant Examiner*—Dang Dinh Le
(74) *Attorney, Agent, or Firm*—Morgan & Finnegan LLP

(57) ABSTRACT

A regulator sub-assembly for an alternator comprises a substrate having a through aperture, with an integrated circuit component mounted within this aperture, while an elementary electronic component other than an integrated circuit (and being for example a capacitor) is also fixed to the substrate. The elementary component is surface mounted on the substrate.

14 Claims, 1 Drawing Sheet

SUB-ASSEMBLIES WITH ELECTRONIC COMPONENTS, FOR MOTOR VEHICLE ALTERNATORS

FIELD OF THE INVENTION

This invention relates to sub-assemblies for motor vehicle alternators, the sub-assemblies being of the kind (such as brush carriers or connectors) which include electronic components.

BACKGROUND OF THE INVENTION

In a motor vehicle alternator, it is typical practice at the present time to arrange the brush carrier or connector in the form of a substrate together with an integrated circuit component, or chip, which is mounted in a through hole formed in the substrate. Such an arrangement is sometimes called naked chip assembly. When the sub-assembly also includes an elementary electronic component such as an inductor, a capacitor, a resistor or a diode, a component is provided which extends through the substrate and which is secured by brazing or electrical soldering on the conductive strips which are associated with the chip. However, this arrangement gives rise to the need for a specific mounting and soldering operation. This means that manufacture is lengthy and costly. In addition, it is necessary to provide specific connections on the components of the sub-assembly, and to protect the soldered connections against corrosion and short circuits.

DISCUSSION OF THE INVENTION

An object of the invention is to provide a sub-assembly which is quicker and cheaper to make.

According to the invention in a first aspect, a regulator sub-assembly for an alternator, comprising a substrate having an aperture, an integrated circuit component mounted in the aperture, and an elementary electronic component other than an integrated circuit, the said elementary component being fixed to the substrate, is characterised in that the elementary component is surface mounted on the substrate.

Thus in a sub-assembly according to the invention, it is possible to deposit the elementary component on the substrate at the same time as the integrated circuit component is placed in position. In consequence, these two placings can be carried out one after the other by the same machine. It is then no longer necessary to provide a specific positioning step for the elementary component. In this way manufacture is made faster, and the cost price of the sub-assembly is reduced. In addition, the material for attachment to the substrate, for example by adhesive bonding or brazing, can be the same material for both of the two electronic components, and this again gives rise to economy.

The substrate is preferably formed with a recess contiguous to the aperture, the elementary component being mounted in the recess.

Preferably, the integrated circuit component and the elementary electronic component are both encapsulated within a common uninterrupted layer of a suitable protective material. Thus protection of both of these components can be ensured in a common single step of the manufacturing process.

The sub-assembly preferably includes a protective cover overlying the integrated circuit component and the elementary electronic component. This provision of a protective cover, common to both of the electronic components, reduces the amount of material that has to be used, and also the number of steps in the manufacturing process.

The elementary electronic component is preferably connected directly to one terminal of the integrated circuit component.

The elementary component may consist of a capacitor, and is preferably connected directly to the ground of the sub-assembly.

The sub-assembly may include means for mounting carbon brushes in the alternator; alternatively it may for example include a connector.

According to the invention in a second aspect, an alternator, in particular for a motor vehicle, includes a sub-assembly according to the first aspect of the invention.

According to the invention in a third aspect, a method of making a regulator sub-assembly for an alternator, in which an integrated circuit component is mounted within a through aperture in a substrate of the sub-assembly, and an elementary electronic component other than an integrated circuit is fixed to the substrate, is characterised in that the elementary component is surface mounted on the substrate.

Further features and advantages of the invention will appear more clearly on a reading of the following detailed description of a preferred embodiment of the invention, which is given by way of non-limiting example only and with reference to the accompanying drawing.

BRIEF DESCRIPTION OF THE DRAWING

The single FIGURE of the drawing is a view in cross section showing part of a sub-assembly for an alternator in accordance with the invention.

DESCRIPTION OF A PREFERRED EMBODIMENT OF THE INVENTION

Figure 1:
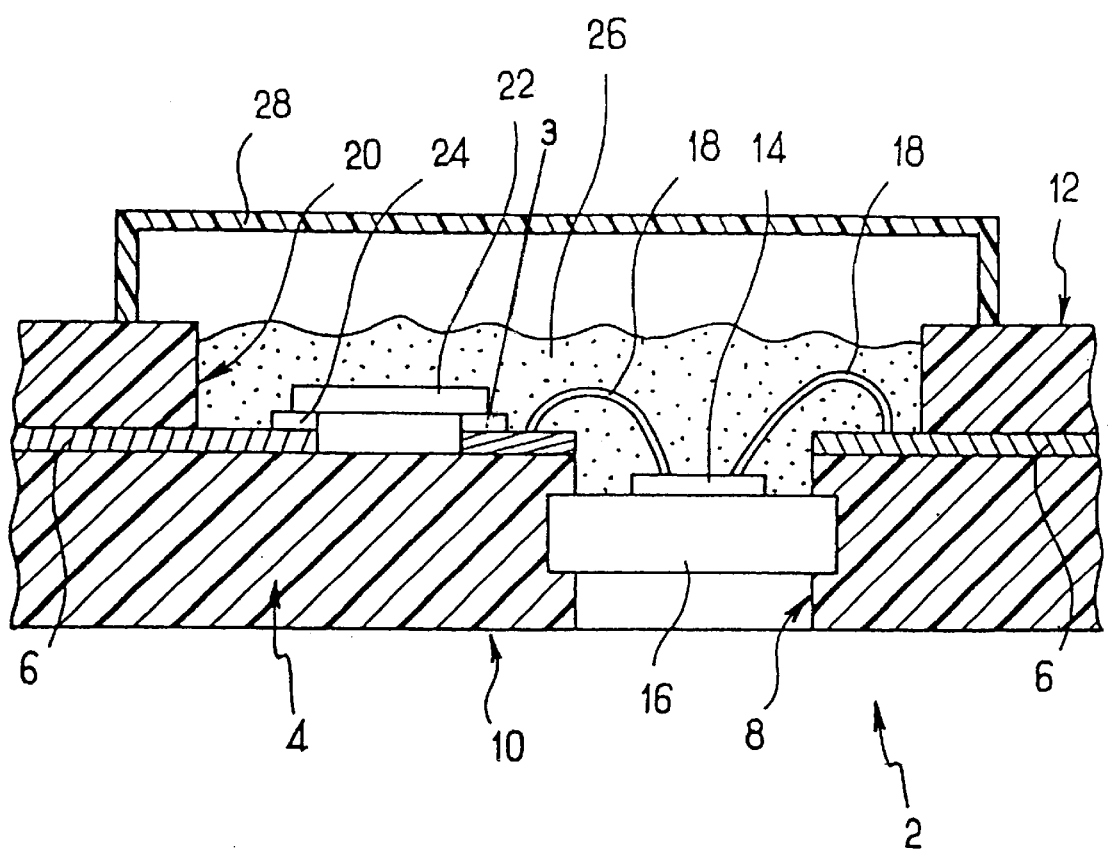

In the drawing, the alternator, for a motor vehicle, includes a sub-assembly 2, which may for example include a brush carrier or a connector 3. The sub-assembly comprises a substrate 4 of a suitable plastics material, shown in section through its thickness in the drawing. The sub-assembly 2 also includes electrically conductive metallic cards 6, on which the substrate 4 has been formed by moulding, so that the conductors 6 are essentially encapsulated within the substrate 4. The substrate 4 is formed with an aperture 8, which in this example is a through hole which is open on both the opposed flat faces 10 and 12 of the substrate. This aperture may however, in other versions, be open only in the upper face 1 2 of the substrate. The aperture in the plastic substrate mirrors a corresponding aperature in the electrically conductive metallic cards 6 (i.e., metallic conductors or conductive substrate).

The sub-assembly 2 includes a regulator 14 in the form of an integrated circuit or chip, which is mounted on a heat sink 16, or radiating block. The heat sink 1 6 is fixed in the substrate 4, in the through aperture 8. The regulator 14 is fixed on the side of the heat sink 16 which faces towards the upper face 12 of the substrate 4. The substrate also includes wires 18 for connecting the regulator 14 to the metallic conductors 6, and via the latter to other parts of the sub-assembly.

The substrate 4 has an opening or cavity 20, which is a blind cavity but which is contiguous with the aperture 8, surrounding the latter and open through the upper face 12 of the substrate, so that part of the metallic conductors 6 is exposed. The sub-assembly further includes an elementary electronic component 22 (which is not an integrated circuit). In the present example the component 22 is a capacitor, but it could just as well be a diode, a resistor or an inductor. The elementary component 22 is surface mounted in the blind recess 20, and for this purpose it is adhesively bonded to the substrate 4 and to the metallic conductors 6, by means of a layer 24 of a suitable conductive adhesive.

A protective material such as a silicone gel 26 fills the recess 20 and the through aperture 8 above the heat sink 16, in such a way that the two components 14 and 22 are encapsulated in the resulting layer of silicone gel 26.

Finally, the sub-assembly includes a protective cover 28 of suitable plastics material, which is fixed to the upper face 12 of the substrate 4 and which encloses the layer of silicone gel 26 together with the two electronic components 14 and 22.

In order to construct the sub-assembly 2, the integrated circuit component 14 and the elementary component are mounted in and the conductive substrate 6, using the same machine and the same attachment material (that is to say, for example, a bonding adhesive as in the layer 24, or braze metal applied by brazing). They are then encapsulated within the common layer of silicone gel 26, and finally the protective cover 28 is fitted.

The elementary component 22 is for example a capacitor which is connected directly, firstly to a power supply terminal of the regulator 14, and secondly to the ground of the sub-assembly 2. With different capacitors mounted in this way, the internal power supplies of the chips are stabilised, or the inputs and outputs are protected against electrostatic discharges.

Several integrated circuit components 14 and/or several elementary components 22 may be included in the sub-assembly.

The components 14 and 22 may be protected by separate protective gel layers 26, and/or by separate protective covers 28. They may also be disposed in separate openings or recesses in the substrate.

What is claimed:

1. A regulator sub-assembly for an alternator, the sub-assembly comprising:

a conductive substrate defining an aperture and an opening contiguous with the aperture;

an integrated circuit component mounted in the aperture; and an elementary electronic component, other than an integrated circuit, mounted in the opening and fixed to the conductive substrate, wherein the elementary electronic component is surface mounted on the conductive substrate.

2. A sub-assembly according to claim 1, further including an uninterrupted common layer of protective material overlying the conductive substrate, the integrated circuit component and the elementary electronic component being encapsulated within the uninterrupted common layer of protective material.

3. A sub-assembly according to claim 1, further including a protective cover overlying both the integrated circuit component and the elementary electronic component.

4. A sub-assembly according to claim 1, further including means connecting the elementary component directly to a terminal of the integrated circuit component.

5. A sub-assembly according to claim 1 defining a ground, the elementary electronic component being a capacitor connected directly to said ground.

6. A sub-assembly according to claim 1, further including a carbon brush carrier.

7. A sub-assembly according to claim 1, being a connector.

8. An alternator for a motor vehicle including a sub-assembly according to claim 1.

9. A sub-assembly according to claim 1, further including an insulating substrate moulded at least partly around the conductive substrate and having an aperture corresponding to the aperture in the conductive substrate.

10. A sub-assembly according to claim 9 wherein the electrically insulating substrate has a blind recess in which the conductive substrate is positioned.

11. An alternator comprising the regulator sub-assembly of claim 1.

12. A sub-assembly for an alternator, the sub-assembly comprising:

a conductive substrate having an first aperture and an opening contiguous with the first aperture;

an insulating substrate moulded at least partly around the conductive substrate, the insulating substrate having a blind recess and an second aperture corresponding to the first aperture;

an integrated circuit component mounted in the first aperture and the second aperture; and an elementary electronic component, other than an integrated circuit, mounted in the opening and fixed to the conductive substrate.

13. A sub-assembly according to claim 12, further including an uninterrupted common layer of protective material overlying the conductive substrate and filling the blind recess to encapsulate the integrated circuit component and the elementary electronic component.

14. The sub-assembly of claim 12, wherein the elementary electronic component is surface mounted.

* * * * *